United States Patent
Kim et al.

(10) Patent No.: US 8,493,782 B2
(45) Date of Patent: Jul. 23, 2013

(54) MEMORY DEVICE AND PROGRAM METHOD THEREOF

(75) Inventors: Jinhyuk Kim, Hwaseong-si (KR); Donggi Lee, Yongin-si (KR); Taesung Jung, Seoul (KR); Byungse So, Seongnam-si (KR); Duckhyun Chang, Seoul (KR); SangLyul Min, Seoul (KR); Bryan Suk Joon Kim, Yongin-si (KR)

(73) Assignees: Samsung Electronics Co., Ltd., Gyeonggi-do (KR); Seoul National University R&DB Foundation, Seoul (KR)

( * ) Notice: Subject to any disclaimer, the term of this patent is extended or adjusted under 35 U.S.C. 154(b) by 379 days.

(21) Appl. No.: 12/580,579

(22) Filed: Oct. 16, 2009

(65) Prior Publication Data

US 2010/0103735 A1    Apr. 29, 2010

(30) Foreign Application Priority Data

Oct. 28, 2008  (KR) ........................ 10-2008-0105759

(51) Int. Cl.
*G11C 11/34* (2006.01)
(52) U.S. Cl.
USPC ............ 365/185.03; 365/185.17; 365/185.18; 365/185.22; 365/185.24

(58) Field of Classification Search
USPC ............ 365/185.03, 185.09, 185.19, 185.24, 365/185.33, 185.17, 185.18, 185.22
See application file for complete search history.

(56) References Cited

U.S. PATENT DOCUMENTS

| 5,936,884 | A | 8/1999 | Hasbun et al. | |
|---|---|---|---|---|
| 6,667,903 | B2 | 12/2003 | De Sandre et al. | |
| 2002/0149963 | A1 | 10/2002 | De Sandre et al. | |
| 2007/0002613 | A1* | 1/2007 | Rahman et al. | 365/185.03 |
| 2007/0153574 | A1* | 7/2007 | Kouno | 365/185.03 |
| 2008/0037328 | A1* | 2/2008 | Toda | 365/185.21 |
| 2008/0158990 | A1* | 7/2008 | Wan et al. | 365/185.22 |

FOREIGN PATENT DOCUMENTS

| JP | 09-231782 | 9/1997 |
|---|---|---|
| KR | 10-0297465 | 5/2001 |
| WO | WO 97/12368 | 4/1997 |

* cited by examiner

*Primary Examiner* — Pho M Luu
*Assistant Examiner* — Thao Buithao Bui
(74) *Attorney, Agent, or Firm* — Harness, Dickey & Pierce, P.L.C.

(57) ABSTRACT

Provided are a flash memory system and a driving method thereof. A flash memory device according to an embodiment of the present invention includes a memory cell array including a plurality of memory cells, and a control logic. The control logic performs control for one-bit information to be stored in the plurality of memory cells. The control logic controls storing data in the plurality of memory cells multiple times without an erasion operation. Accordingly, the flash memory device does not execute an erasion operation, increasing an operation speed.

14 Claims, 20 Drawing Sheets

MEMORY DEVICE AND PROGRAM METHOD THEREOF

FOREIGN PRIORITY STATEMENT

This U.S. non-provisional patent application claims priority under 35 U.S.C. §119 to Korean Patent Application No. 10-2008-0105759, filed on Oct. 28, 2008, in the Korean Intellectual Property Office (KIPO), the entire contents of which are incorporated herein by reference.

BACKGROUND OF THE INVENTION

The present invention disclosed herein relates to a nonvolatile memory, and more particularly, to a nonvolatile memory and a driving method thereof, which enable a multi program operation.

Generally, flash memory may be categorized into NAND flash memory and NOR flash memory. NOR flash memory has a structure in which each memory cell is connected to a bit line and a word line. Accordingly, NOR flash memory has the characteristic of superior random access speed.

NAND flash memory includes a plurality of memory cells that are connected in series, and thus it requires only one contact per cell string. Accordingly, NAND flash memory is characterized by a superior degree of integration.

Recently, research has been made on multi bit cells that may store a plurality of data in one memory cell for further improving the degree of integration of flash memory. A memory cell using such a scheme is commonly called a Multi-Level Cell (MLC). In contrast, single-bit memory cells are called Single-Level Cells (SLC). Generally, an MLC has two or more threshold voltage distributions.

SUMMARY OF THE INVENTION

The present invention provides a flash memory device and a driving method thereof, which can reduce the load of a host central processing unit (CPU).

Embodiments of the present invention provide a nonvolatile memory device including: a memory cell array including a plurality of memory cells; and a control logic controlling storing of one-bit information in the plurality if memory cells, wherein the memory cells are programmed a plurality of times without an erasion operation.

In some embodiments, each of the plurality of memory cells may include a multi level cell, wherein the multi level cell may store data according to a program level. The program level may be classified by a plurality of verification voltages.

In other embodiments, the control logic may control reading of the multi level cell based on the verification voltages for checking the program level.

In still other embodiments, the control logic is configured to that when data to be updated differ from the stored data, the multi level cell may be programmed with the data to be updated according to the program level.

In even other embodiments, the control logic is configured so that when the data to be updated are the same as the stored data, the multi level cell may maintain a current state.

In yet other embodiments, the control logic may generate an error signal if a program operation can no longer be executed.

In other embodiments of the present invention, a nonvolatile memory device includes: a memory cell array including a plurality of memory cells; and a control logic controlling an overwriting operation of the memory cell array, wherein one bit information is represented by a group of memory cells from among the plurality of memory cells.

In still other embodiments of the present invention, a memory system includes: a nonvolatile memory device; and a central processing unit controlling the nonvolatile memory device, wherein the nonvolatile memory device includes: a memory cell array including a plurality of memory cells; and a control logic controlling storing of one-bit information in each of the plurality of memory cells, wherein the memory cells are programmed multiple times without an erasion operation.

BRIEF DESCRIPTION OF THE FIGURES

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF PREFERRED EMBODIMENTS

Figure 1:
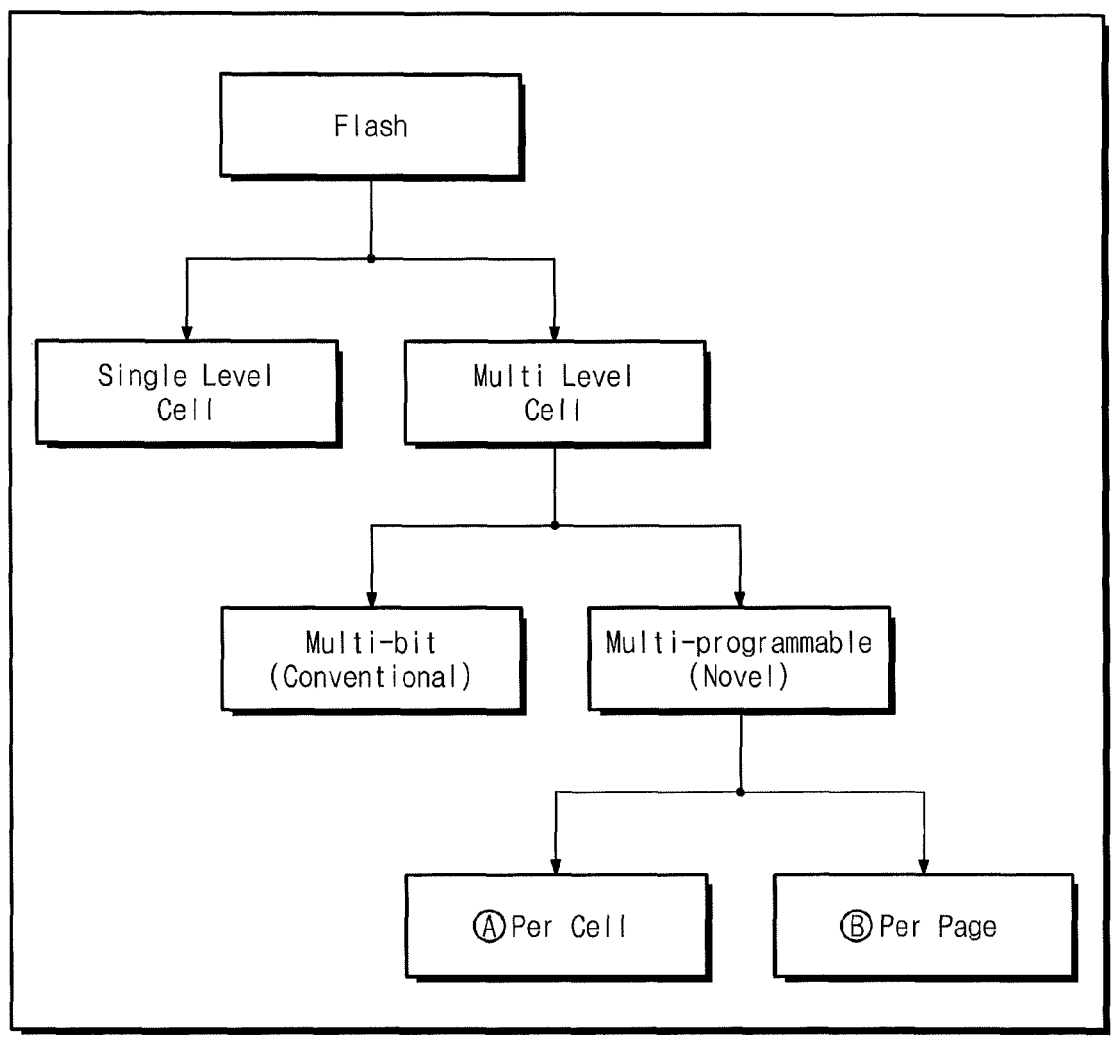
FIG. 1 is a block diagram illustrating a multi programmable flash memory according to an embodiment of the present invention.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Exemplary embodiments of the present invention provide a multi programmable flash memory device.

FIG. 1 is a block diagram illustrating a multi programmable flash memory according to an embodiment of the present invention.

Referring to FIG. 1, one memory cell of a flash memory device may be divided into a Single-Level Cell (SLC) having a single level and a Multi-Level Cell (MLC) having two or more threshold voltage distributions.

The flash memory device including the MLC may be used to store multiple bits. Moreover, the flash memory device including the MLC according to embodiments of the present invention may support a multi program operation.

In the flash memory device, the multi program operation is to update data in the memory cell of the flash memory device without performing an erasion operation. That is, the flash memory device that supports the multi program operation may continuously perform a program operation without performing the erasion operation.

Like the A case of FIG. 1, the flash memory device including the MLC may support a multi program operation for each memory cell. Like the B case of FIG. 1, the flash memory device including the MLC may bundle memory cells, which shares the same page buffer, to support the multi program operation.

The flash memory device including the MLC may update a current data to a new data for executing the multi program operation irrespective of whether the current data that is stored in the memory cell of the flash memory device is '0' or '1'.

A method for executing a multi program operation for each memory cell will be described below with reference to FIGS. 3 and 4. A multi program method using a state model will be described below with reference to FIG. 9. A method that bundles memory cells sharing the same page buffer to execute a multi program will be described below with reference to FIGS. 14 through 17.

I. Multi Program Method Having Finite State

Figure 2:
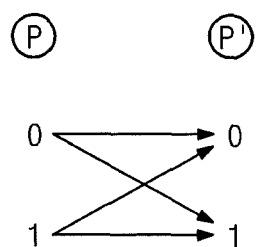
FIG. 2 is a diagram illustrating multi program conditions according to embodiments of the present invention.

The present invention should satisfy all conditions as illustrated in FIG. 2. That is, a memory cell according to embodiments of the present invention may be multi-programmed on all the combinations of previous data.

Referring to FIG. 2, P is the current data of a memory cell, P' is data to be updated in the memory cell. If P is '0', '0' or '1' may be updated in P'. Moreover, if P is '1', '0' or '1' may be updated in P'.

The multi program method according to an embodiment of the present invention may execute the multi program on data that is stored in the memory cell of the flash memory device and all combinations capable of updating the data.

Figure 3:
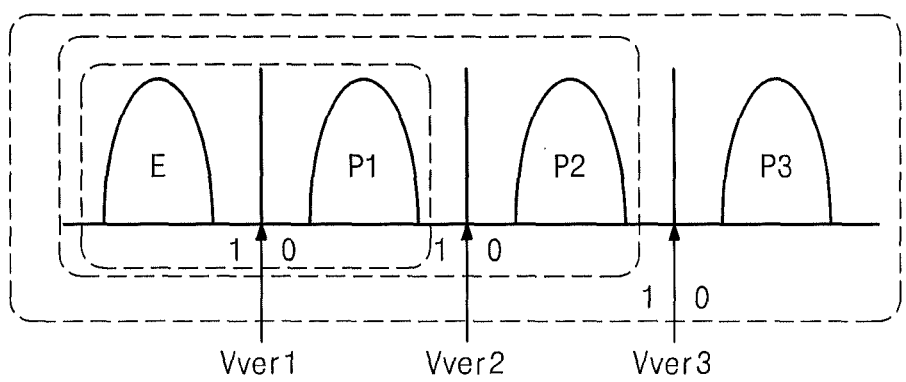
FIG. 3 is a graph illustrating a multi program method in a flash memory device according to an embodiment of the present invention.

FIG. 3 is a graph illustrating a multi program method in a flash memory device according to an embodiment of the present invention. FIG. 4 is a diagram illustrating a multi program method in a memory cell that is illustrated in FIG. 3.

A flash memory device according to an embodiment of the present invention includes an MLC. The flash memory device does not divide a Most Significant Bit/Least Significant Bit (MSB/LSB) page and recognizes the MSB/LSB page as one state, thereby supporting a multi program without performing an erasion operation.

It is assumed that a memory cell in FIG. 3 has four voltage distributions. That is, the four voltage distributions are composed of an erasion state E, a first program state P1, a second program state P2, and a third program state P3. The four voltage distributions are sectionalized by first to third verification voltages Vver1 to Vver3.

In embodiments of the present invention, a flash memory technology including a typical MLC is used. According to embodiments of the present invention, that is, the multi program operation is executed in one memory cell, reducing wear-our count. Accordingly, an effective and high-performance memory storage system can be realized.

Figure 4:
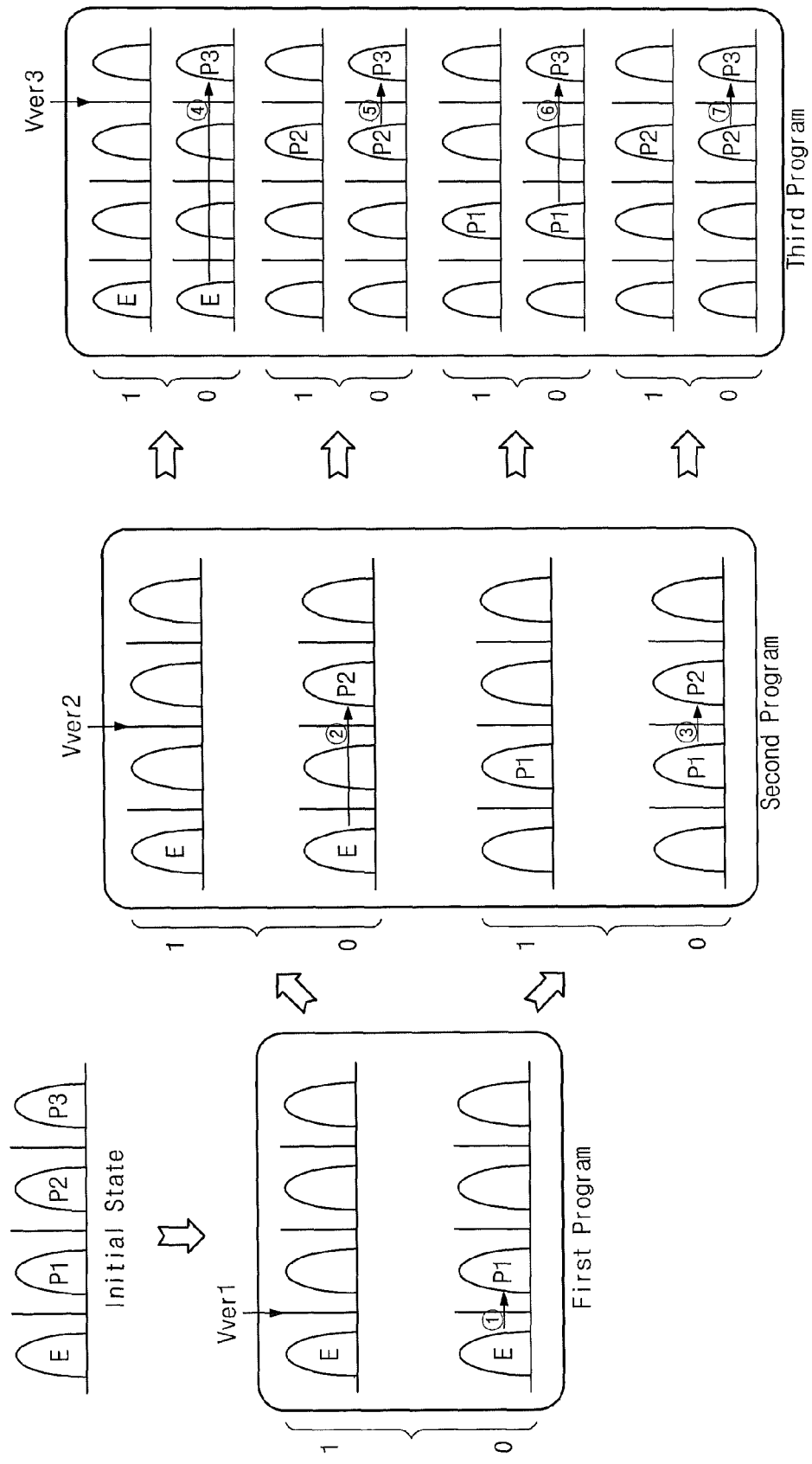
FIG. 4 is a diagram illustrating a multi program method in a memory cell in FIG. 3.

Referring to FIGS. 3 and 4, it is assumed that the initial state of a memory cell is the erasion state E.

In a first program stage, the memory cell maintains the erasion state E as-is when data to be updated in the memory cell is '1', and when data to be updated in the memory cell is '0', the memory cell is programmed from the erasion state E into the first program state P1.

In a second program stage, the memory cell maintains the erasion state E as-is when the previous data of the memory cell is '1' and data to be updated in the memory cell is '1', and when data to be updated in the memory cell is '0', the memory cell is programmed from the erasion state E into the second program state P2.

In the second program stage, the memory cell maintains the first program state P1 as-is when the previous data of the memory cell is '0' and data to be updated in the memory cell is '1', and when data to be updated in the memory cell is '0', the memory cell is programmed from the first program state P1 into the second program state P2.

In a third program stage, the memory cell maintains the erasion state E or the first program state P1 as-is when the previous data of the memory cell is '1' and data to be updated in the memory cell is '1', and when data to be updated in the memory cell is '0', the memory cell is programmed from the erasion state E into the third program state P3 or from the first program state P1 into the third program state P3.

In the third program stage, the memory cell maintains the second program state P2 as-is when the previous data of the memory cell is '0' and data to be updated in the memory cell is '1', and when data to be updated in the memory cell is '0', the memory cell is programmed from the second program state P2 into the third program state P3.

In the first program stage, the program of the memory cell is verified on the basis of the first verification voltage Vver1. In the second program stage, the program of the memory cell is verified on the basis of the second verification voltage Vver2. In the third program stage, the program of the memory cell is verified on the basis of the third verification voltage Vver3.

Accordingly, the flash memory device according to an embodiment of the present invention may execute the multi program operation three times when it includes an MLC representing two bits. That is, the flash memory device, which includes an MLC representing n bits, may execute the multi program $2^n-1$ times.

When a multi program operation according to embodiments of the present invention is applied, the flash memory device according to embodiments of the present invention determines a verification voltage level before a read operation or a program operation.

For example, first, the flash memory device may use a method that sets a program count bit for each page, and checks the program count bit to determine a voltage level upon the read operation. The program count bit corresponding to the each page may be stored in the inside or outside of the flash memory device. Second, for searching a program level corresponding to the each page, the flash memory device may use a method that scans verification voltages in descending order from the highest verification voltage to read a memory cell. There may be more than one program count bit. The number of program count bits may depend on the number of times a multi program operation may be executed without erasion.

The read operation of the flash memory device according to embodiments of the present invention is performed on the basis of any one of the first to third verification voltages in FIG. 3.

For example, when a memory cell supporting a multi program operation is in the erasion state E, it is read on the basis of the first verification voltage Vver1. When the memory cell supporting the multi program operation is in the first program state P1, it is read on the basis of the second verification voltage Vver2. When the memory cell supporting the multi program operation is in the second program state P2, it is read on the basis of the third verification voltage Vver3.

When the voltage distribution of the memory cell is disposed at the left of the verification voltage, the data of the memory cell represents '1'. When the voltage distribution of the memory cell is disposed at the right of the verification voltage, the data of the memory cell represents '0'.

The first to third verification voltages Vver1 to Vver3 in FIGS. 3 and 4 are used as indicators, respectively. That is, the indicator according to embodiments of the present invention represents the program level of the memory cell.

Figure 5:
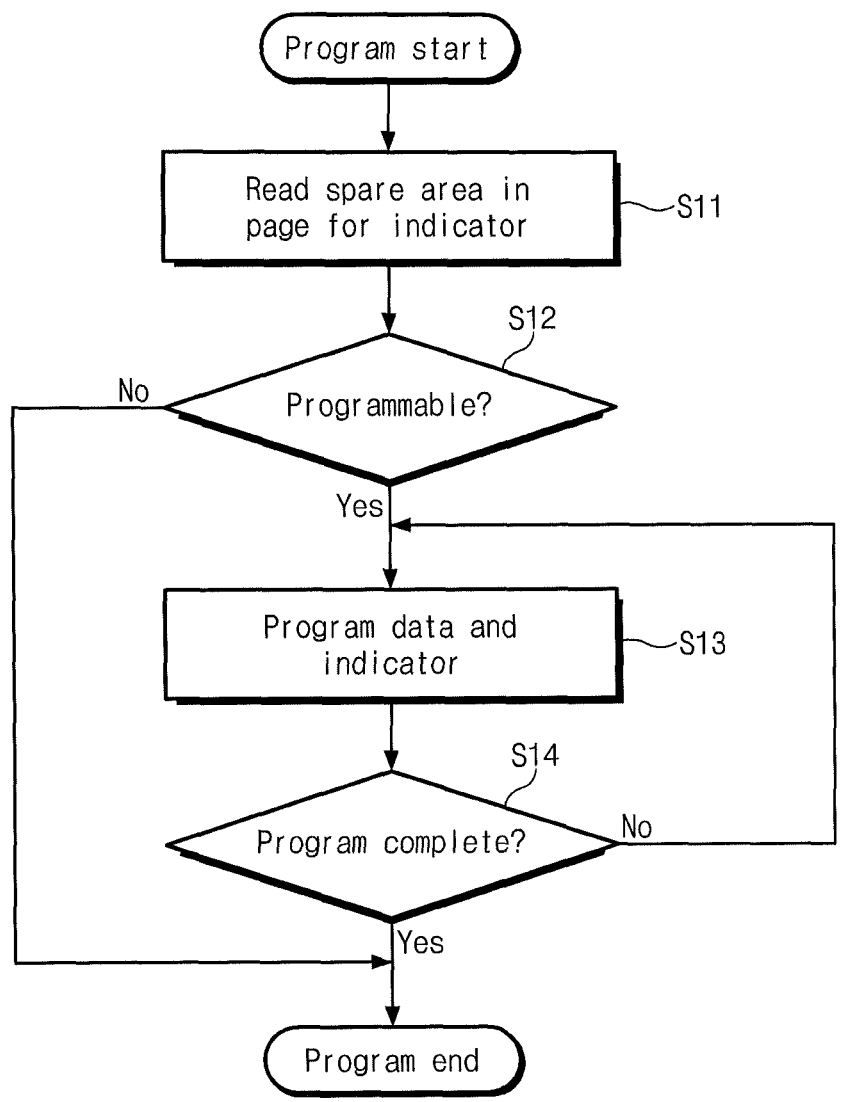
FIG. 5 is a flowchart illustrating a multi program method according to an embodiment of the present invention in FIG. 4.
Figure 6:
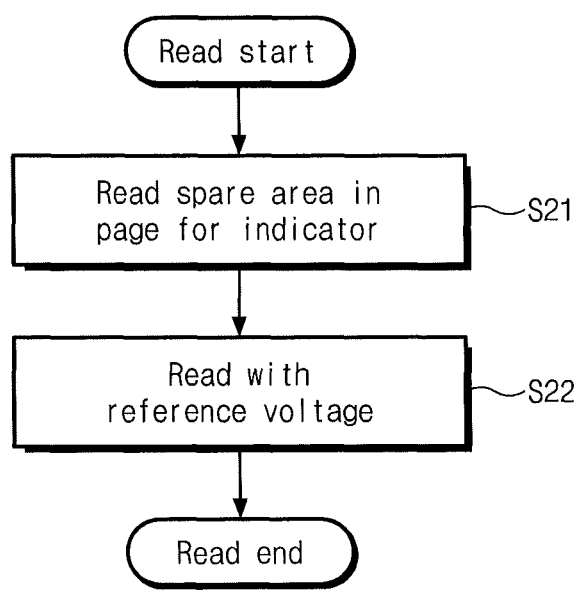
FIG. 6 is a flowchart illustrating a method for reading a memory cell according to the multi program method in FIG. 5.
Figure 7:
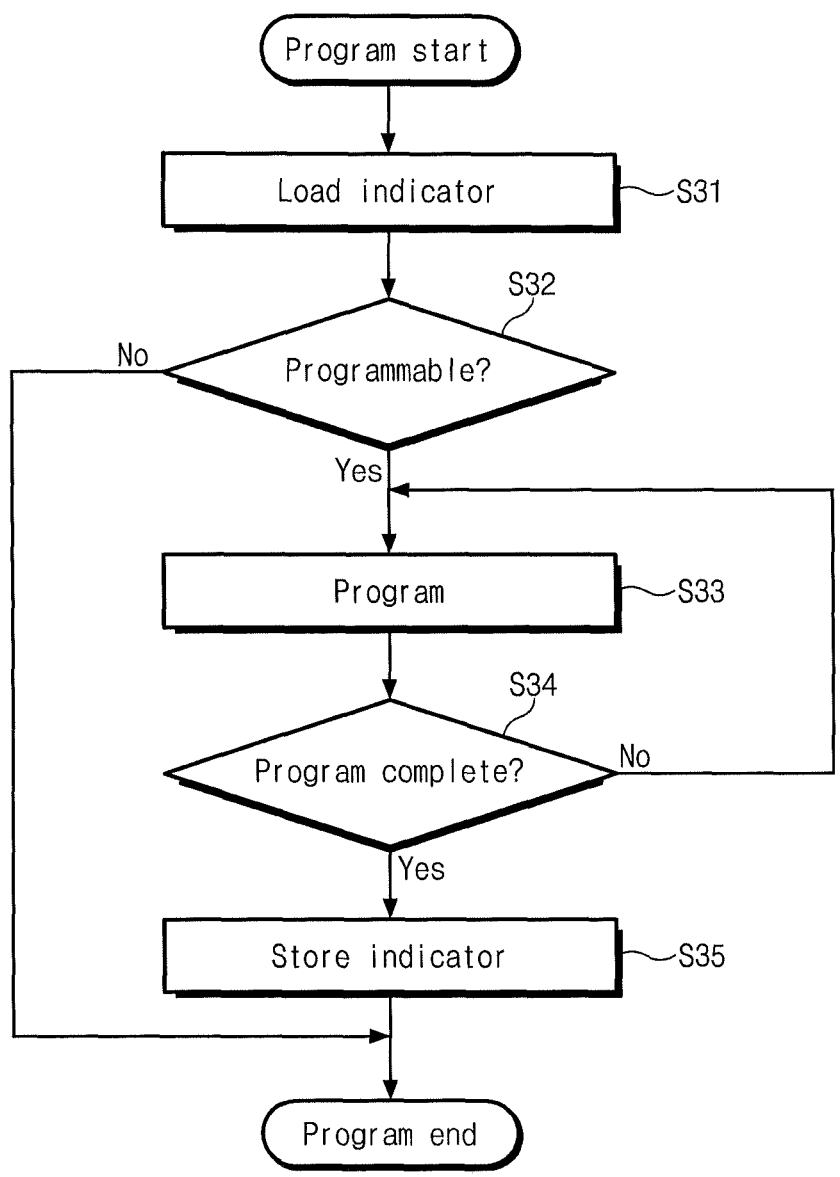
FIG. 7 is a flowchart illustrating a multi program method according to another embodiment of the present invention in FIG. 4.
Figure 8:
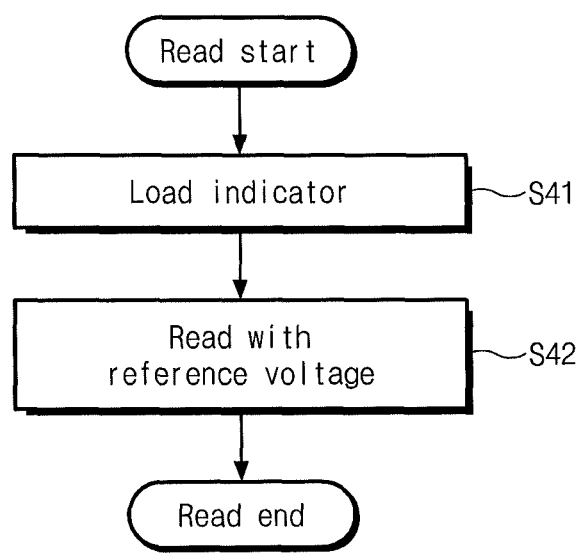
FIG. 8 is a flowchart illustrating a method for reading a memory cell according to the multi program method in FIG. 7.

FIGS. 5 and 6 illustrate a case in which the state information (i.e., the indicator) of the memory cell is stored in the inside of a memory cell array. FIGS. 7 and 8 illustrate a case in which the state information (i.e., the indicator) of the memory cell is stored in the outside of the memory cell array.

FIG. 5 is a flowchart illustrating a multi program method according to an embodiment of the present invention in FIG. 4.

Referring to FIG. 5, a multi program method according to an embodiment of the present invention reads a spare area in an arbitrary page for an indicator in operation S11, and determines whether a programming operation is possible in operation S12. When it is impossible to program, the multi program method ends programming. When the program operation may be executed, the multi program method programs data and the indicator in operation S13, and determines whether a program operation is completed in operation S14. When the program operation is completed, the multi program method ends programming.

FIG. 6 is a flowchart illustrating a method for reading a memory cell according to the multi program method in FIG. 5.

Referring to FIG. 6, a method for reading a memory cell according to an embodiment of the present invention reads a spare area in an arbitrary page for an indicator in operation S21, reads the memory cell with a reference voltage corresponding to the indicator in operation S22, and ends reading.

FIG. 7 is a flowchart illustrating a multi program method according to another embodiment of the present invention in FIG. 4.

Referring to FIG. 7, a multi program method according to another embodiment of the present invention loads an indicator in operation S31, and determines whether a programming operation is possible in operation S32. When it is impossible to execute a program operation, the multi program method ends programming. When the program operation may be executed, the multi program method programs data in operation S33, and determines whether a program operation is completed in operation S34. When the program operation is completed, the multi program method stores the indicator in the outside in operation S35, and ends programming.

FIG. 8 is a flowchart illustrating a method for reading a memory cell according to the multi program method in FIG. 7.

Referring to FIG. 8, a read method according to an embodiment of the present invention loads an indicator in operation S41, reads a memory cell with a reference voltage corresponding to the indicator in operation S42, and ends reading.

II. Multi Program Method Having State Model

Figure 9:
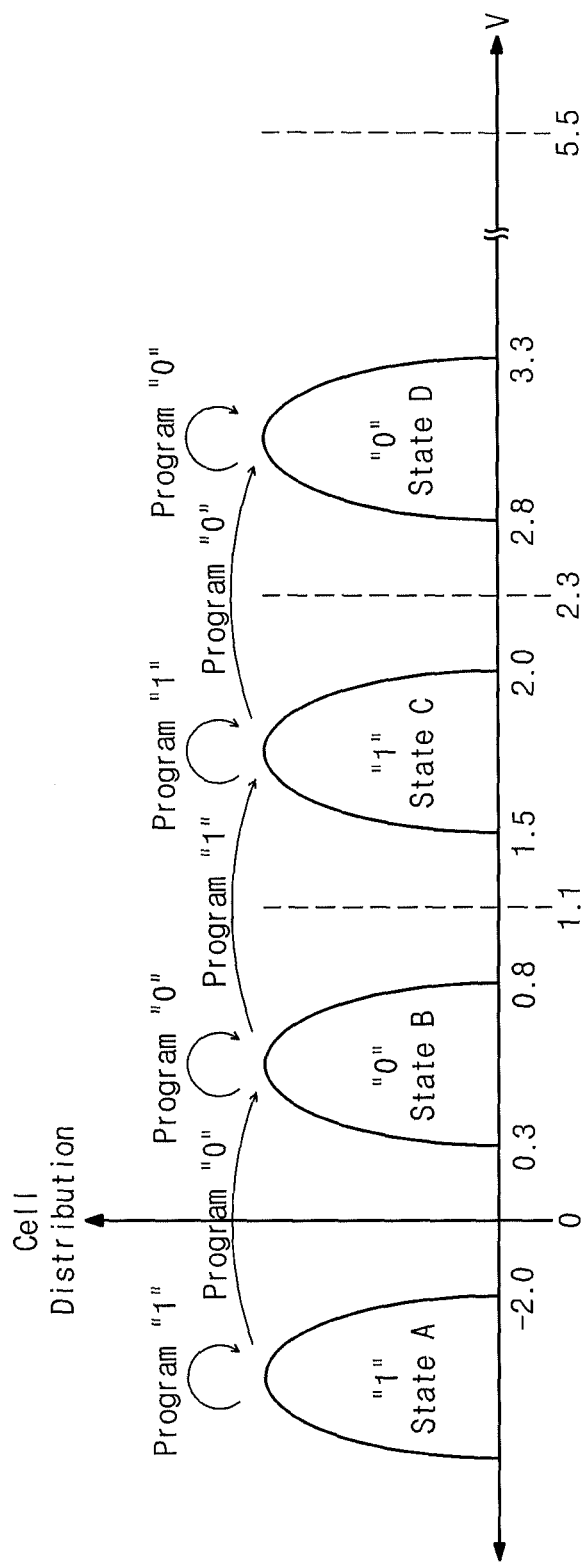
FIG. 9 is a graph illustrating a program method according to another embodiment of the present invention.

FIG. 9 is a graph illustrating a program method according to another embodiment of the present invention.

That is, FIG. 9 illustrates an example in which the states of one memory cell in FIG. 4 are represented as one bit. It is assumed that the memory cell may have four voltage distributions. A state, in which the floating gate of the memory cell is erased, represents '1'. A state, in which a small amount of electrons are injected, represents '0'. A state, in which a larger amount of electrons are injected, represents '1'. A state, in which a largest amount of electrons are injected, represents '0'.

The following Table 1 represents a processing method when there is a writing request to the flash memory device according to an embodiment of the present invention.

TABLE 1

| Current state | Current bit | Bit to program | Program? | Verification Volt |
|---|---|---|---|---|
| A | 1 | 1 | No | — |
| A | 1 | 0 | Yes | 0.3 V |
| B | 0 | 1 | Yes | 1.5 V |
| B | 0 | 0 | No | — |
| C | 1 | 1 | No | — |
| C | 1 | 0 | Yes | 2.8 V |
| D | 0 | 1 | Error | — |
| D | 0 | 0 | No | — |

Referring to the Table 1 and FIG. 9, a non-written state is a state A, and the state A represents a bit of '1'. As a method for checking whether the memory cell of the flash memory device according to an embodiment of the present invention is in the state A, the state A can be seen through a current which flows when a voltage of 0 V is applied to the control gate of the memory cell. In the state A, a program operation is not executed when a writing request that indicates to write '1' is inputted, and when a writing request that indicates to write '0' is inputted, a program operation is executed to proceed a state B. At this point, the first verification voltage Vver1 is 0.3 V.

The state B represents a bit of '0'. As a method for checking whether the memory cell of the flash memory device according to an embodiment of the present invention is in the state B, the state B can be seen through a current which flows when a voltage of 1.1 V is applied to the control gate of the memory cell although a current does not flow when a voltage of 0 V is applied to the control gate of the memory cell. In the state B, a program operation is not executed when a writing request that indicates to write '0' is inputted, and when a writing request that indicates to write '1' is inputted, a program is executed to proceed a state C. At this point, the second verification voltage Vver2 is 1.5 V.

The state C represents a bit of '1'. As a method for checking whether the memory cell of the flash memory device according to an embodiment of the present invention is in the state C, the state C can be seen through a current which flows when a voltage of 2.3 V is applied to the control gate of the memory cell although a current does not flow when a voltage of 1.1 V is applied to the control gate of the memory cell. In the state C, a program is not executed when a writing request that indicates to write '1' is inputted, and when a writing request that indicates to write '0' is inputted, a program is executed to proceed a state D. At this point, the third verification voltage Vver3 is 2.8 V.

The state D represents a bit of '0'. As a method for checking whether the memory cell of the flash memory device according to an embodiment of the present invention is in the state D, the state D can be seen through a current does not flow when a voltage of 2.3 V is applied to the control gate of the memory cell. In the state D, a program operation is not executed when a writing request that indicates to write '0' is inputted, and when a writing request that indicates to write '1' is inputted, an error occurs.

As described above, the multi program method according to an embodiment of the present invention programs '0' upon a first program, programs '1' upon a second program and programs '0' upon a third program, in one memory cell. That is, the multi program method according to an embodiment of the present invention may execute a multi program three times.

Because one memory cell may execute a multi program three times, if overwriting is not repeated only in the same memory cell but is performed in a entire page (which has a size of 2 KB), the total number of overwriting times may further increase.

Moreover, if the number of states (which one memory cell may have) increases, the number of overwriting times may increase. That is, as described above, when the memory cell of the flash memory device according to an embodiment of the present invention has a N number of states more than four states, a multi program may be executed N−1 times.

The flash memory device according to an embodiment of the present invention may perform an overwriting operation, and may further include two features.

First, in the flash memory device according to an embodiment of the present invention, a writing time may be shortened to, for example, the same 200 μs as the writing time of an SLC. Because a program that skips over several stages may be executed in the case of an MLC storing two bits, a time of about 800 μs taken in a worst case. On the other hand, the multi program method according to an embodiment of the present invention always executes one stage of a program operation or does not execute a program operation, thus ensuring a short program time.

Second, the multi program method according to an embodiment of the present invention preferentially performs a read operation to check the state of a memory cell to be currently programmed. The multi program method according to an embodiment of the present invention preferentially performs a read operation to compare information of a program level with data to be programmed. As shown in FIG. 9, in the flash memory device according to an embodiment of the present invention, update is performed according to the comparison result.

If it is assumed that the flash memory device according to an embodiment of the present invention has four states, the flash memory device according to an embodiment of the present invention may require, for example, three registers for each memory cell. That is, two registers are required for reading the four states of a memory cell, and one register is required for storing data to be newly updated.

Moreover, if it is assumed that the flash memory device according to an embodiment of the present invention has eight states, the flash memory device according to an embodiment of the present invention may require, for example, four registers for each memory cell. That is, three registers are required for reading the eight states of a memory cell, and one register is required for storing data to be newly updated.

Because a 2-bit multi level cell that supports a cache program has three registers for each memory cell, only a logic circuit for combining stored bits may be added.

Figure 10:
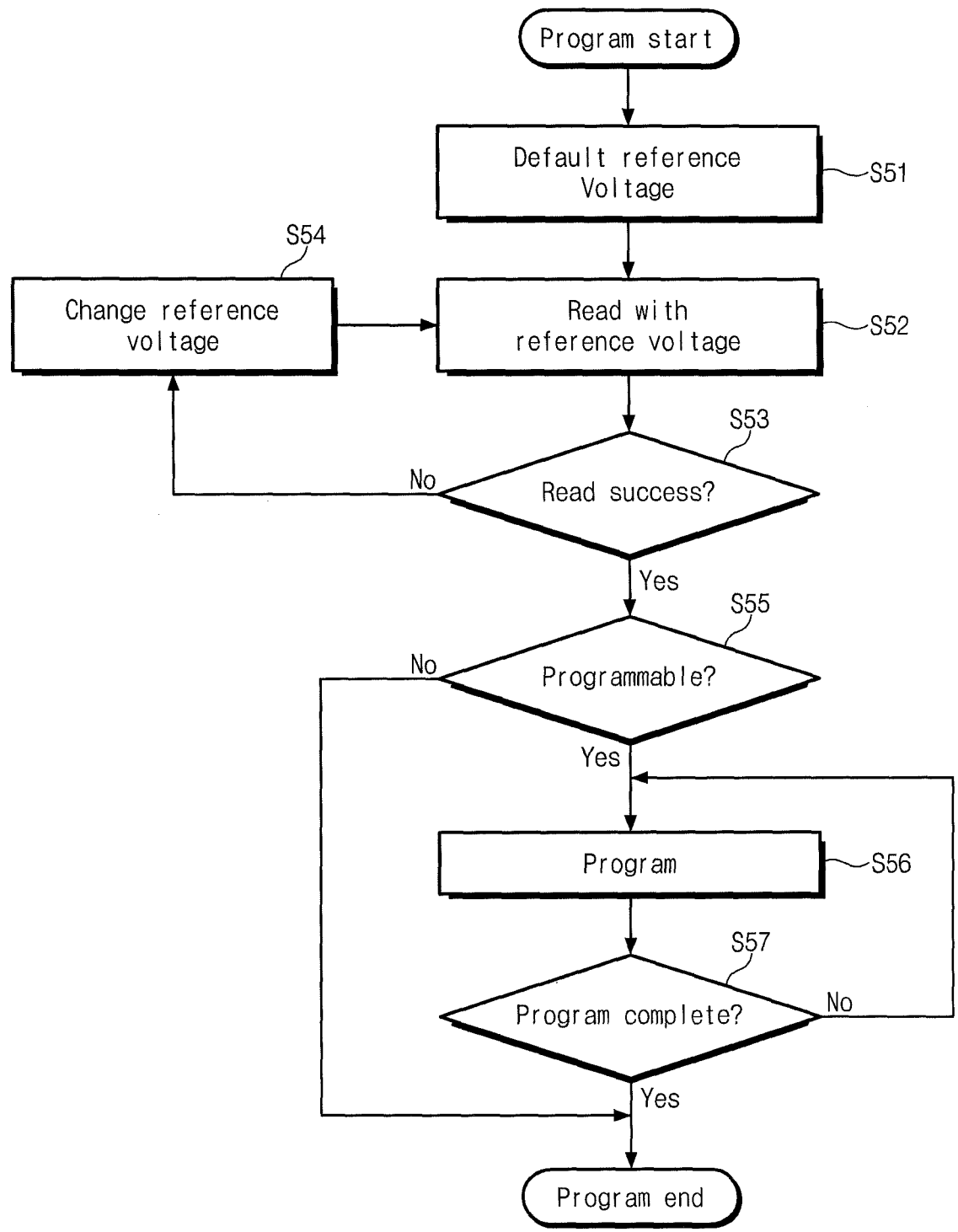
FIG. 10 is a flowchart illustrating a multi program method in FIG. 9.

FIG. 10 is a flowchart illustrating the multi program method in FIG. 9.

Referring to FIG. 10, the multi program method according to an embodiment of the present invention sets a default reference voltage for detecting the current state of a multi program cell in operation S51, performs a read operation with the set reference voltage in operation S52, and determines whether the read operation succeeds in operation S53. When the read operation fails, the multi program method changes the reference voltage in operation S54. When the read operation succeeds, the multi program method determines whether a program operation is possible in operation S55. When it is impossible to program, the multi program method ends programming. When the multi program method may program, it programs in operation S56, and determines whether a program operation is completed in operation S57. When the program operation is completed, the multi program method ends the program operation.

In the reference voltage according to an embodiment of the present invention, an intermediate level of default reference voltage among a plurality of reference voltages is set as a default reference voltage for quickly detecting the current state of a memory cell.

That is, when a read operation is executed with the intermediate level of default reference voltage, the current state of the memory cell may be read as '0' or '1'. When '1' is read, the reference voltage is set as a lower reference voltage. When '0' is read, the reference voltage is set as a higher reference voltage. Accordingly, the current detailed state of the memory cell is detected. A time for detecting the state of the memory cell according to an embodiment of the present invention is further shortened than a case in which the reference voltages are applied in ascending order from a low voltage to a high voltage.

Figure 11:
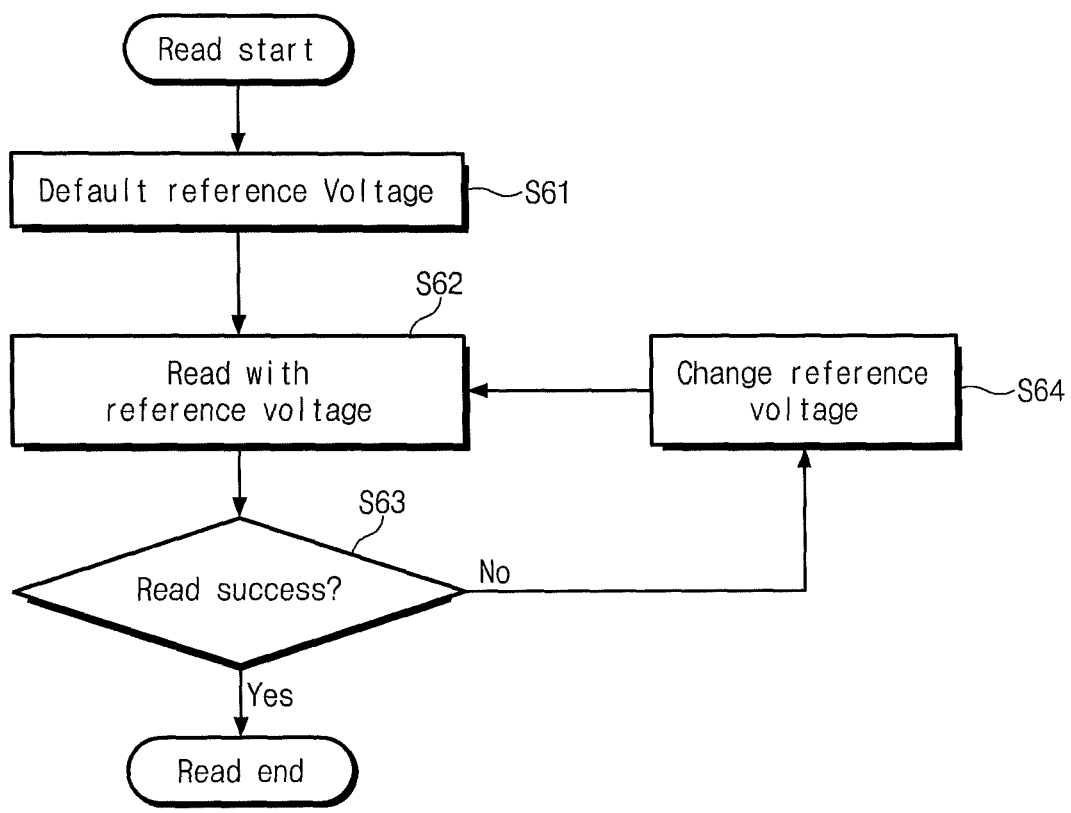
FIG. 11 is a flowchart illustrating a method for reading a memory cell according to the multi program method in FIG. 9.

FIG. 11 is a flowchart illustrating a method for reading a memory cell according to the multi program method in FIG. 9.

Referring to FIG. 11, a read method according to an embodiment of the present invention sets a default reference voltage for detecting the current state of a multi program cell in operation S61, performs a read operation with the set reference voltage in operation S62, and determines whether the read operation succeeds in operation S63. When the read operation fails, the read method changes the reference voltage in operation S64. When the read operation succeeds, the read method ends reading.

One of ordinary skill in the art would recognize that the multi programming methods described above with respect to FIGS. 1-11 may be implemented by either of the memory devices described below with reference to FIGS. 12 and 14. In this case, the memory devices described below with reference to FIGS. 12 and 14 include MLC cell arrays.

III. Multi Program Method for Representing Cells as One Bit

The flash memory device according to an embodiment of the present invention realizes a multi program by representing a plurality of memory cells as one bit in the outside.

Figure 12:
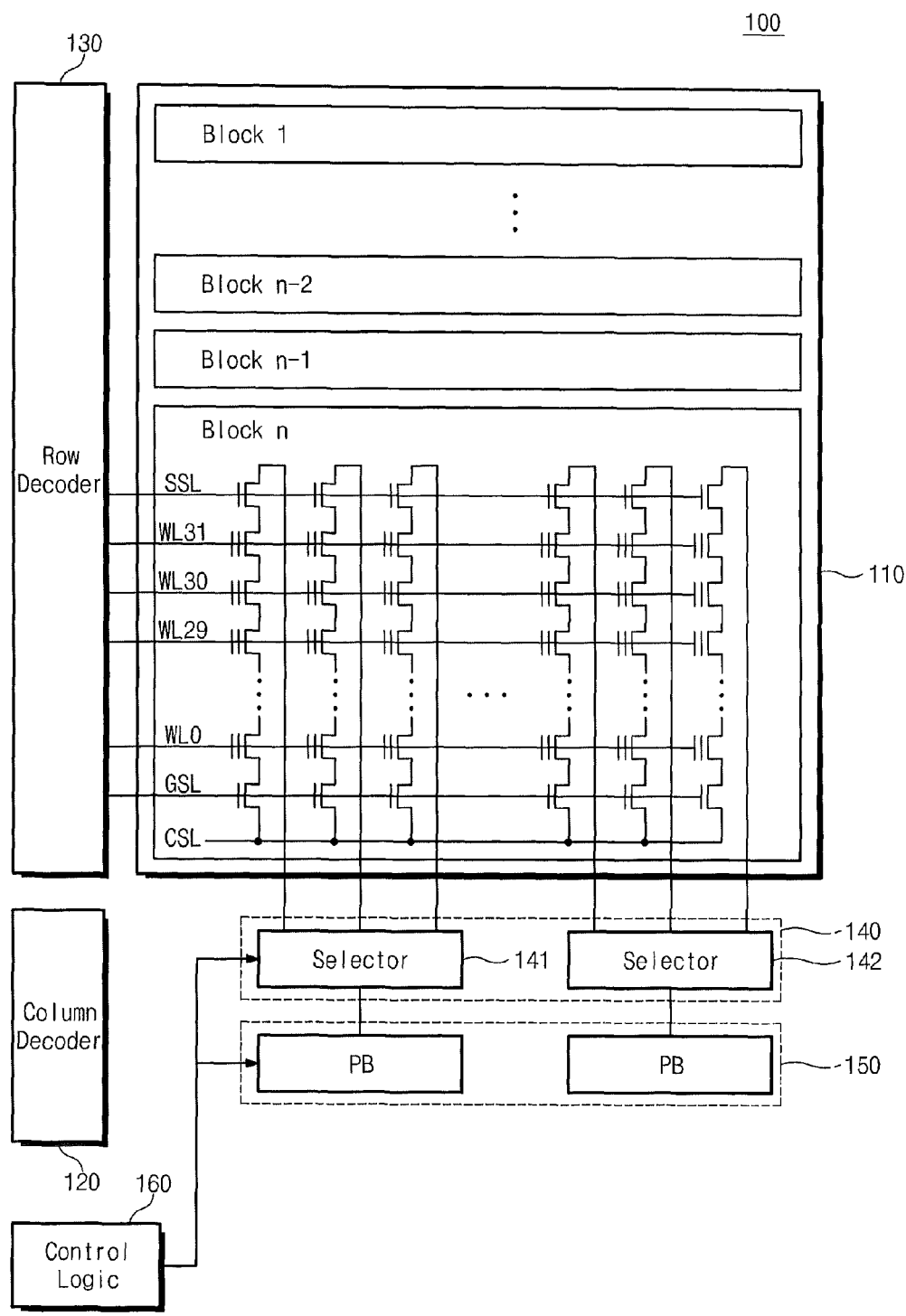
FIG. 12 is a block diagram illustrating a memory device according to another embodiment of the present invention.

FIG. 12 is a block diagram illustrating a memory device according to another embodiment of the present invention.

Referring to FIG. 12, a memory device 100 according to another embodiment of the present invention includes a memory cell array 110, a column decoder 120, a row decoder 130, a selection circuit 140, a page buffer circuit 150, and a control logic 160. Herein, the memory device 100 may be a flash memory device.

The memory device 100 includes the memory cell array 110 for storing an N (where, N is one or more integer) number of states. The memory cell array 110 may be divided into a plurality of areas. These areas may include a spare area and a data area for storing data. The areas of the memory cell array 110 may include a plurality of memory blocks. The configuration of the memory block has been well known to those skilled in the art, and therefore its description will be omitted.

Although not shown, the memory device 100 may further include a voltage generation circuit, a control circuit, and an input/output interface circuit. The page buffer circuit 150 reads/programs data from/to the memory cell array 110 through the selection circuit 140 according to the control of the control circuit. The column decoder 120 and the row decoder 130 are controlled by the control logic 160. The column decoder 120 and the row decoder 130 select the memory block of the memory cell array 110 and select the word line of the selected memory block. The selected word line is driven with a word line voltage from the voltage generation circuit.

The nth block of the memory cell array 110 includes a plurality of cell strings. The plurality of cell strings are formed in groups of three. Three cell strings share one selection circuit, and are connected to the page buffer circuit 150.

That is, as illustrated in FIG. 12, it is assumed that the memory cells, which are connected to the selection circuit 141 and a common word line in the three cell strings, stores 1-bit information.

In a read operation, information on the bit of a corresponding page (which is stored in the memory cells) is read, and the read information is written in the page. In a writing operation, moreover, new information to be updated is written in the memory cells as one bit of one page.

In the read operation, the multi program method according to an embodiment of the present invention reads all the memory cells that are distributed to three cell strings for reading one page. Moreover, the multi program method first reads the memory cells that are distributed to the three cell strings for writing in one page, checks current written information (i.e., a program level), and updates new information. The program level means the number of times programmed on an arbitrary memory cell according to an embodiment of the present invention.

Figure 13:
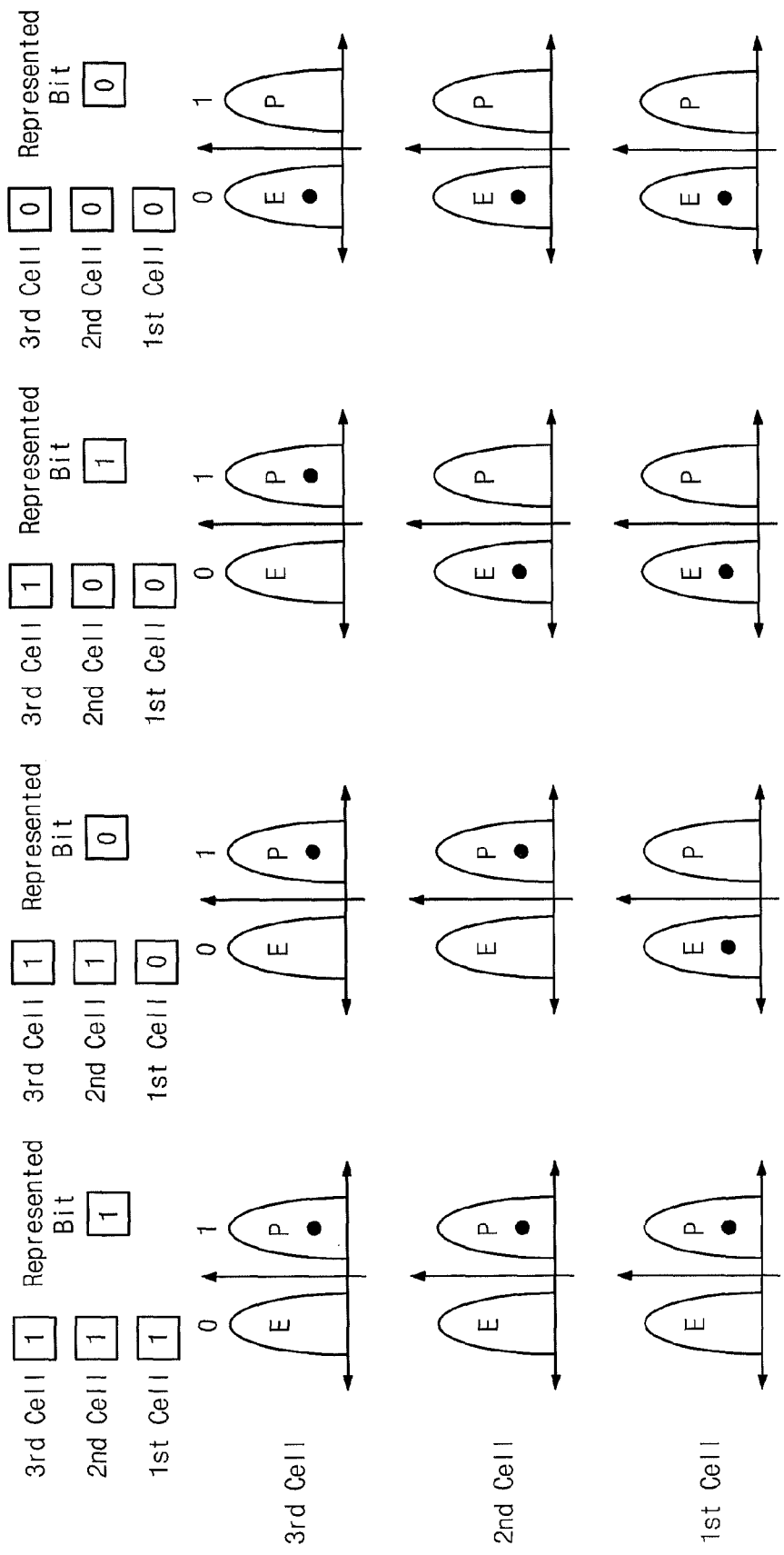
FIG. 13 is a graph illustrating a memory cell array in FIG. 12 based on a program operation according to an embodiment of the present invention.

FIG. 13 is a graph illustrating the memory cell array in FIG. 12 based on a program operation according to an embodiment of the present invention.

Referring to FIGS. 12 and 13, it is assumed that the memory cell array in FIG. 12 includes memory cells that are SLC. The flash memory device according to an embodiment of the present invention, as shown in FIG. 12, bundles three flash memory cells to represent them as one bit.

One bit pertaining to the bundled three flash memory cells represents '1' corresponding to a state in which all the three memory cells are erased. When the first memory cell '1st Cell' of the three memory cells is programmed and thereby a state is '0', a represented bit is represented as '0'. Moreover, when the first and second memory cells '1st Cell' and '2nd Cell' of the three memory cells are programmed, a represented bit is represented as '1'. When all the memory cells '1st Cell', '2nd Cell' and '3rd Cell' of the three memory cells are programmed, a represented bit is represented as '0'.

In the memory cell in FIGS. 12 and 13, all four states are formed using three memory cells having two kinds of states. If all the memory cells are independent, the memory cells may have eight (i.e., 2*2*2) states. However, the memory cell in FIGS. 12 and 13 are in a state in which it is impossible to return without being erased. For example, the multi program method programs the first memory cell '1st Cell', and thereafter it cannot reach a state in which the first memory cell '1st Cell' is not in a programmed state and the second and third memory cells '2nd Cell' and '3rd Cell' are programmed before the programmed first memory cell '1st Cell' is erased. That is, when using an n number of flash memory cells having a k state, all programmable states includes the states by expressions of k+(n*1)(k*1) that obtains by adding the k−1 states of a n−1 number of memory cells to the k states of the first memory cell, and overwriting may be performed multiple times without erasion by expressions of k+(n−1)(k−1)−1.

Figure 14:
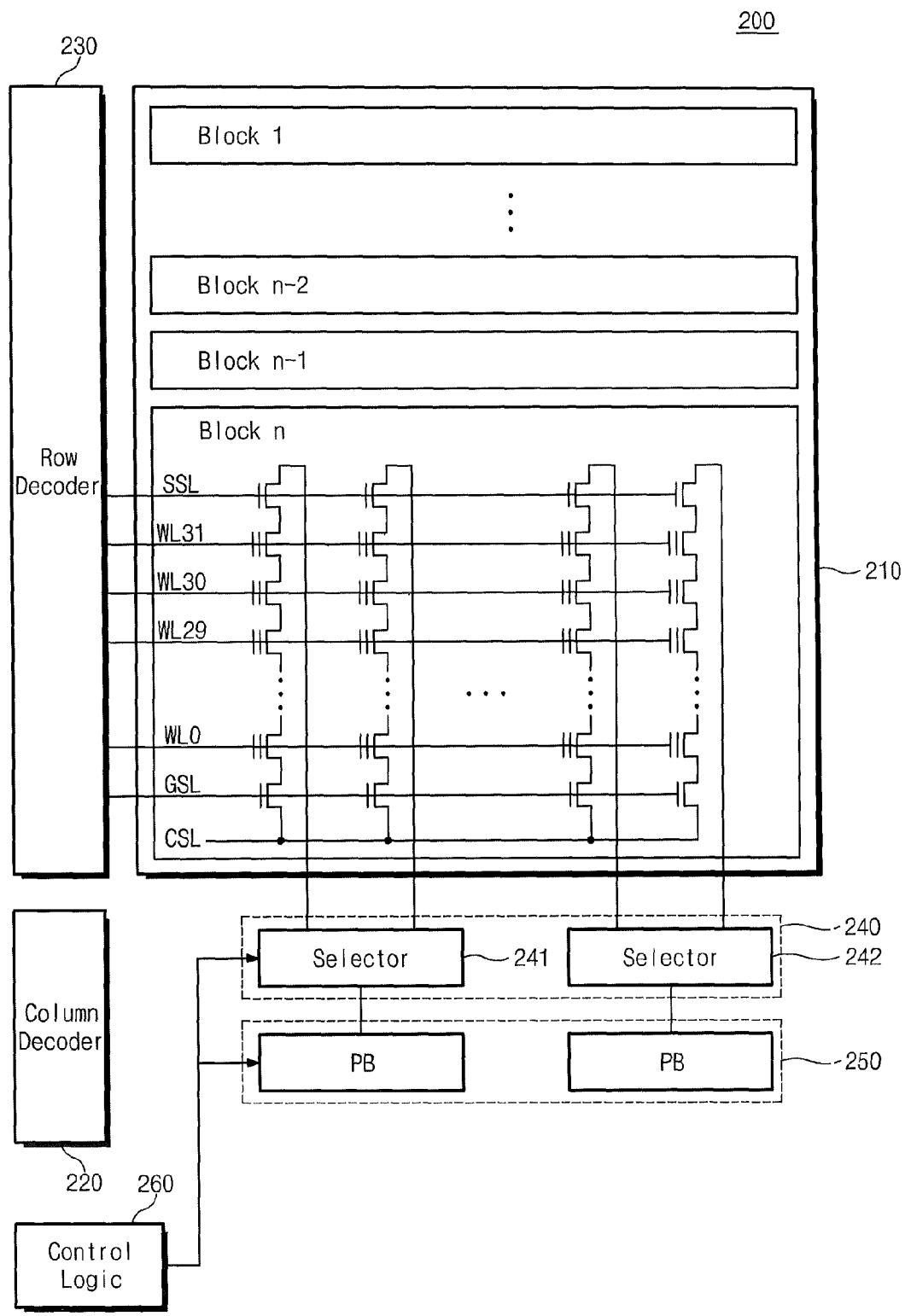
FIG. 14 is a block diagram illustrating a memory device according to another embodiment of the present invention.

FIG. 14 is a block diagram illustrating a memory device according to another embodiment of the present invention.

The memory device in FIG. 14 substantially includes the same elements as those of the memory device in FIG. 12, but its memory cell array 210 differs from the memory cell array 110 of the memory device in FIG. 12. Accordingly, repetitive description will be omitted.

Referring to FIG. 14, the nth memory block of the memory cell array 210 includes a plurality of cell strings. The plurality of cell strings are formed in groups of two. Two cell strings share one sense amplifier, and are connected to a page buffer circuit 250. That is, as illustrated in FIG. 14, it is assumed that the memory cells, which are connected to one selection circuit 241 and a common word line in the two cell strings, stores 1-bit information.

Figure 15:
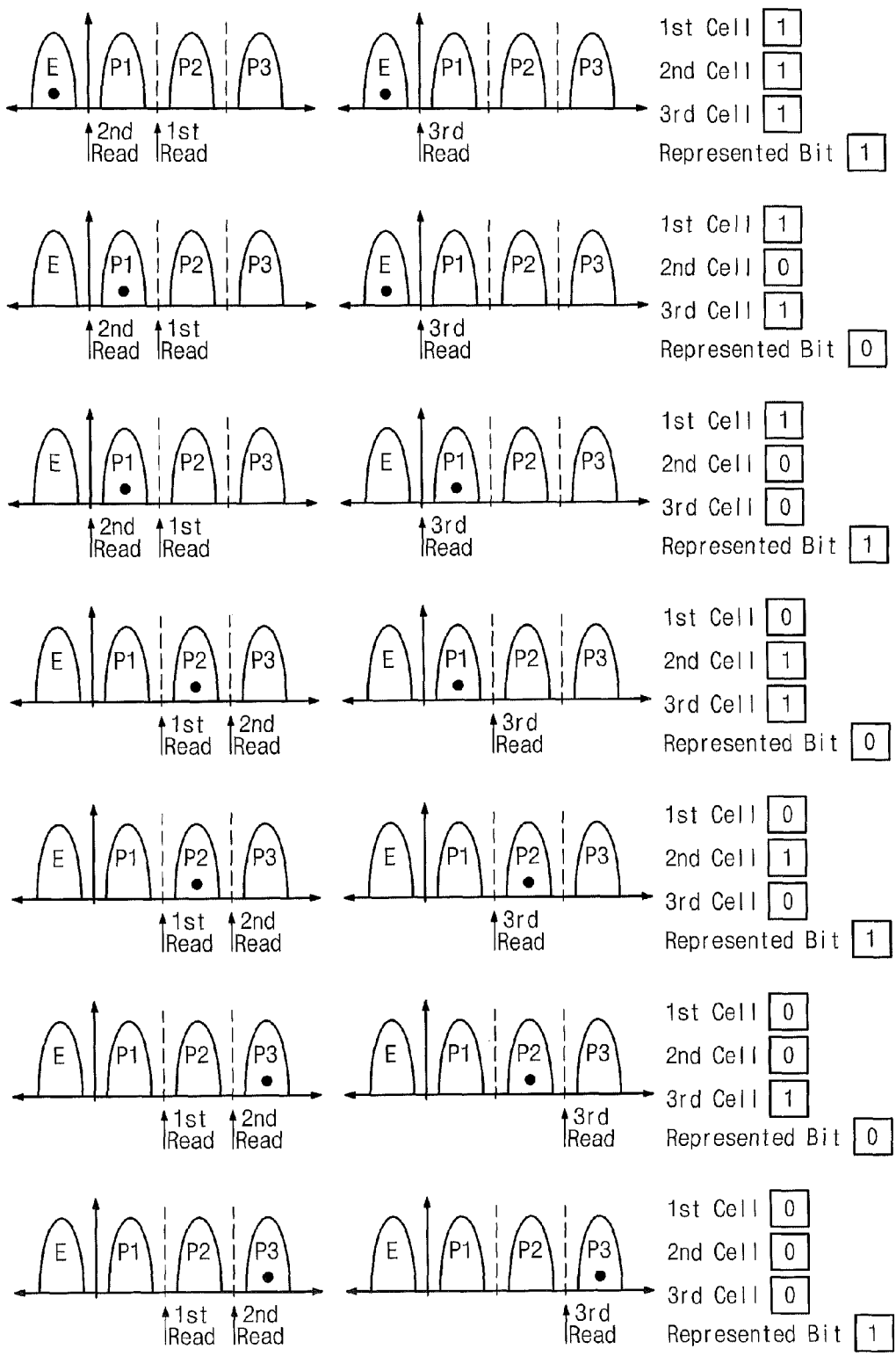
FIG. 15 is a graph illustrating a program operation according to an embodiment of the present invention in a case where a memory cell array in FIG. 14 is an MLC type having four states.

FIG. 15 is a graph illustrating a program operation according to an embodiment of the present invention in a case where the memory cell array in FIG. 14 includes memory cells that are MLC having a four-state. That is, a method that may program in seven kinds of states or three times by using two memory cells having a four-state will be described with reference to FIG. 15.

A four-state memory cell may determine any one of four kinds of states through two-time read operations. When two four-state memory cells are bundled in one and are thereby represented, three-time read operations are required. That is, when one bit is represented with a plurality of flash memory cells, read operations less than the sum of minimum read operations necessary for each memory cell may be required. That is, a prior condition for programming and reading a memory cell through a predetermined bit pattern is required. Accordingly, a next read voltage value is determined according to whether a current flows or not in a first read operation, and a next program level is determined according to an already written state.

In a flash memory device, even page and odd page are divided for each word. The memory cells of the even and odd pages share the same page buffer. Therefore, a method that bundles the two four-state flash memory cells of the even page and the two four-state flash memory cells of the odd page to use them as one bit may be realized by simply applying a typical flash memory device. In this case, as shown in FIG. 15, by reading the contents of the even and odd pages, the memory cells may be distinguished. Based on a result that is distinguished through a read operation, the memory cells may newly be multi-programmed.

IV. Randomize Input Data

The program method according to an embodiment of the present invention performs control so that the number of times an arbitrary memory cell is programmed can be equally distributed, by randomizing input data. Accordingly, the program method according to an embodiment of the present invention may further include a randomization unit for randomizing input data.

Figure 16:
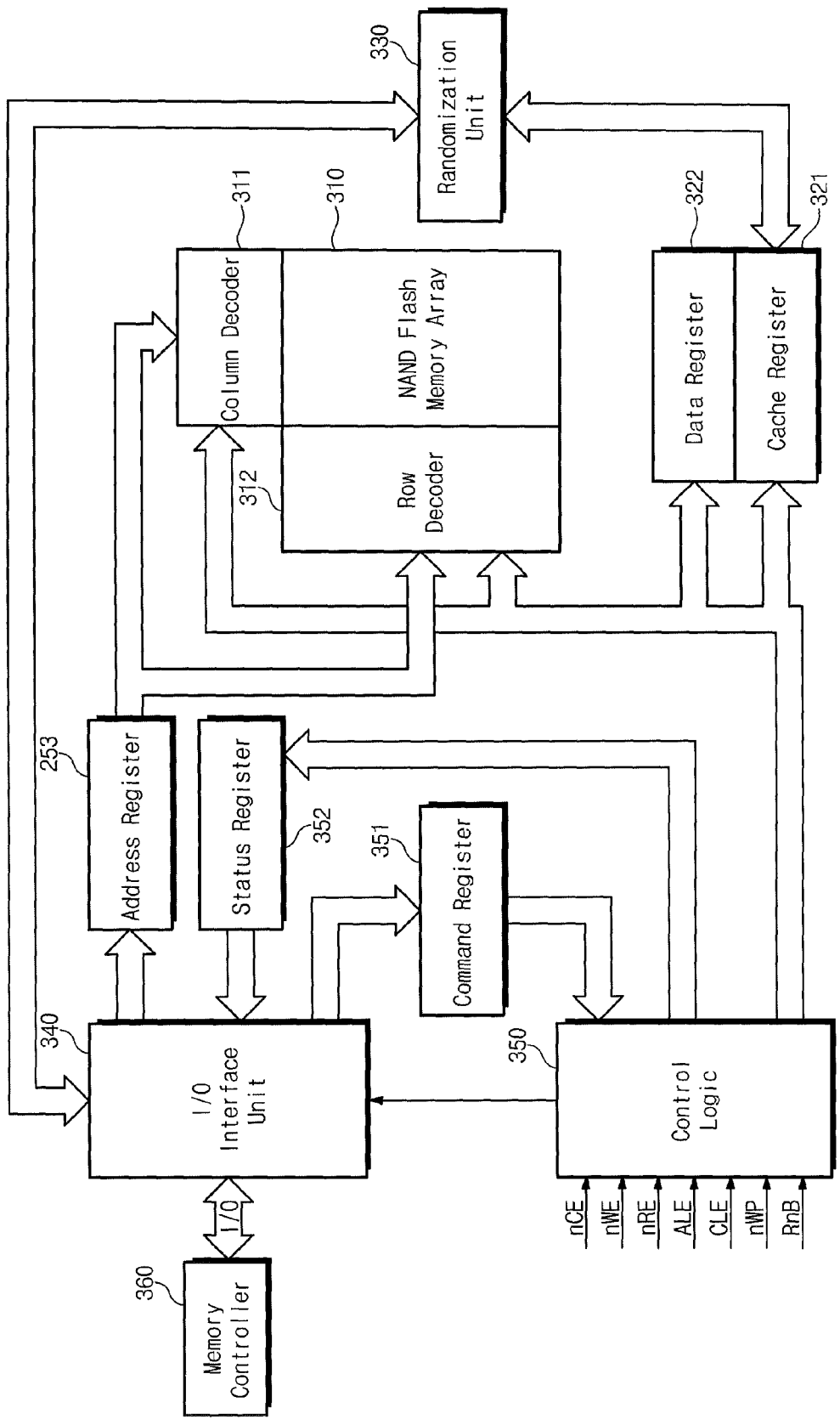
FIG. 16 is a block diagram illustrating a memory system according to an embodiment of the present invention.

FIG. 16 is a block diagram illustrating a memory system according to an embodiment of the present invention.

Referring to FIG. 16, a memory system 300 according to an embodiment of the present invention includes memory devices 310 to 350, and a memory controller (or a flash controller) 360. Herein, the memory device 110 may be a flash memory device.

The memory devices 310 to 350 may include a memory cell array 310, a page buffer circuit (not shown), a column decoder 311, a row decoder 312, a voltage generation circuit (not shown), a control logic 350, and an input/output interface unit 340. These devices have the same functions as functions that have been described above with reference to FIG. 12. Accordingly, repetitive description will be omitted.

Moreover, the memory system 300 may further include a randomization unit 330. The randomization unit 330 is connected between the interface unit 340 and a cache register 321. The randomization unit 330 randomizes data that are inputted from the interface unit 340 and stores the randomized data in the cache register 321.

A memory controller 360 according to an embodiment of the present invention controls the memory devices in response to a request from the outside (for example, a host). Although not shown, the memory controller 360 includes an Error Check and Correct (ECC) memory, a buffer memory, and a processing unit such as a central processing unit (CPU) or a microprocessor. This has been well known in relevant fields.

For preventing the restriction of the number of times an entire page is overwritten, as illustrated in FIG. 16, a specific permutation is applied to data that are inputted. That is, randomization according to an embodiment of the present invention equally spreads data to be programmed through the specific permutation.

Accordingly, randomization according to an embodiment of the present invention effectively prevents the restriction of the number of times the each memory cell of an entire page is overwritten. Moreover, the memory device according to an embodiment of the present invention equally controls the number of times a memory cell is programmed, thereby enhancing life.

TABLE 2

| Write count | After erasion | 1st write | 2nd write | 3rd write |
|---|---|---|---|---|
| 2 | 1 | 1 | 0 | 1 |
| 0 | 1 | 1 | 1 | 1 |
| 0 | 1 | 1 | 1 | 1 |
| 3 | 1 | 0 | 1 | 0 |
| 0 | 1 | 1 | 1 | 1 |
| 0 | 1 | 1 | 1 | 1 |
| 1 | 1 | 1 | 0 | 0 |
| 0 | 1 | 1 | 1 | 1 |

The Table 2 represents a case in which overwriting is continuously requested on the specific bit of one byte. Each row corresponds to one bit of the byte. When a request (which indicates to alternately write '0' and '1' in the fourth bit of one byte) is continuously inputted, the entirety of the byte may be used only three times. On the other hand, most of other bits are in a state where they were not programmed. In this case, therefore, the efficiency of a multi program according to an embodiment of the present invention decreases.

TABLE 3

| Write count | After erasion | 1st write | 2nd write | 3rd write | 4th write | 5th write |
|---|---|---|---|---|---|---|
| 2 | 1 | 1 | 1 | 0 | 1 | 1 |
| 1 | 1 | 1 | 1 | 1 | 0 | 0 |
| 2 | 1 | 1 | 1 | 1 | 0 | 1 |
| 2 | 1 | 0 | 1 | 1 | 1 | 1 |
| 2 | 1 | 1 | 1 | 0 | 1 | 1 |
| 2 | 1 | 1 | 0 | 1 | 1 | 1 |
| 3 | 1 | 1 | 0 | 1 | 1 | 0 |
| 2 | 1 | 1 | 1 | 1 | 0 | 1 |

The Table 3 represents that which results if memory cells, which are written through randomization, are leveled when overwriting is requested. Through randomization according to an embodiment of the present invention, the number of overwriting times is equalized on the entirety of one byte. Accordingly, the efficiency of the multi program operation according to an embodiment of the present invention improves.

Referring to the Table 2 and the Table 3, randomization according to an embodiment of the present invention requires additional information on a randomization seed. When reading data that are stored in the memory device, the randomization seed may be used for correctly decoding the read data.

Moreover, when one byte is randomized through a permutation, the total number of possible cases is 8! (i.e., 40,320). In this case, the randomization seed requires sixteen bits or two bytes. For one page, 2 Kbyte or 4 Kbyte, additional 16-bit information may not correspond to a large amount of data. An entire page is randomized in eight sections according to a permutation, and the each section (128 bytes or 256 bytes) is randomized through the same permutation. According to embodiments of the present invention, therefore, input data can be randomized using a small data amount of randomization seed.

Figure 17:
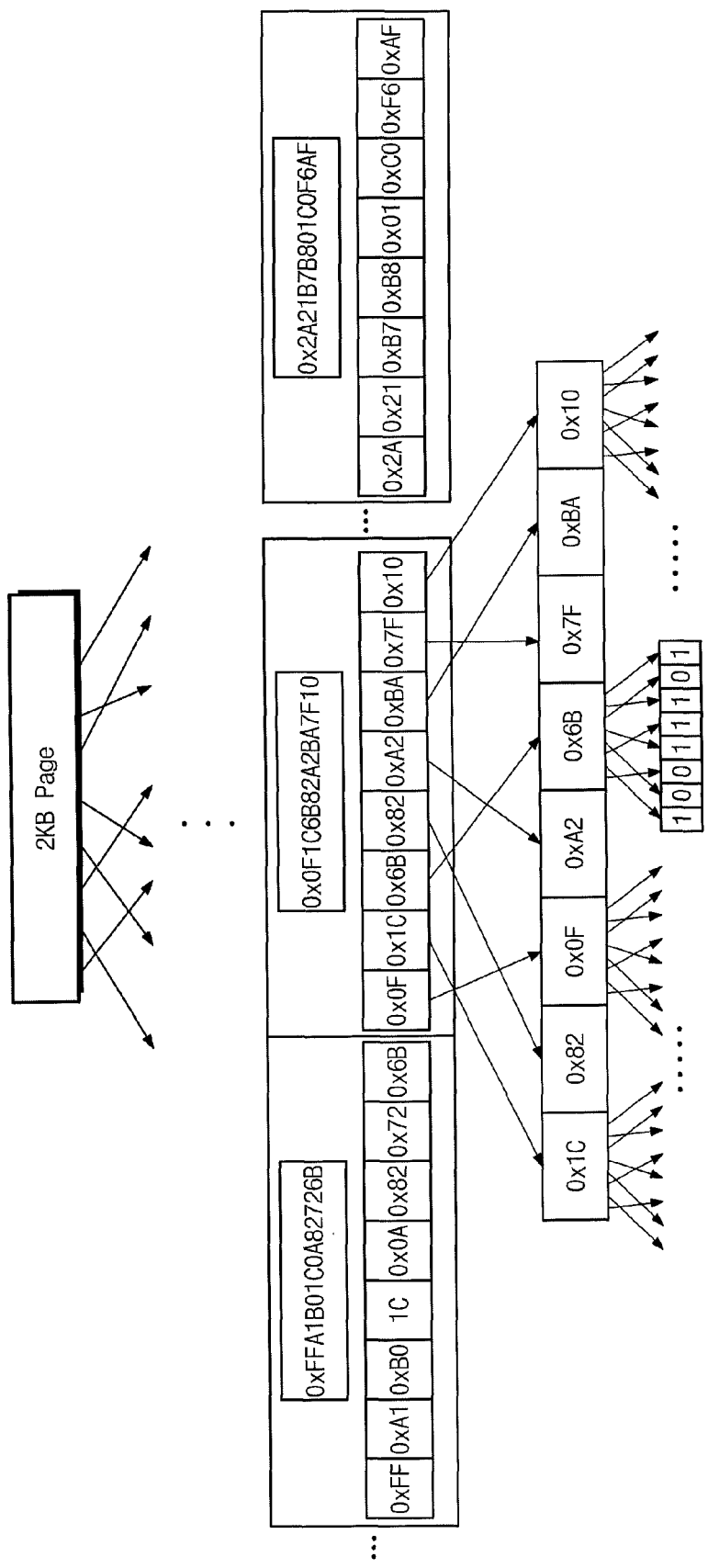
FIG. 17 is a diagram illustrating multi stage randomization according to an embodiment of the present invention.

FIG. 17 is a diagram illustrating multi stage randomization according to an embodiment of the present invention.

Referring to FIG. 17, one page is randomized in eight sections according to an arbitrary permutation, and the data of any one of the sections are randomized according to the same permutation. Added permutation information is recorded in a spare area that is allocated per page, and the spare area may be updated in an overwriting type. When it is impossible to overwrite, the added permutation information may be recorded in the remaining spare areas.

Figure 18:
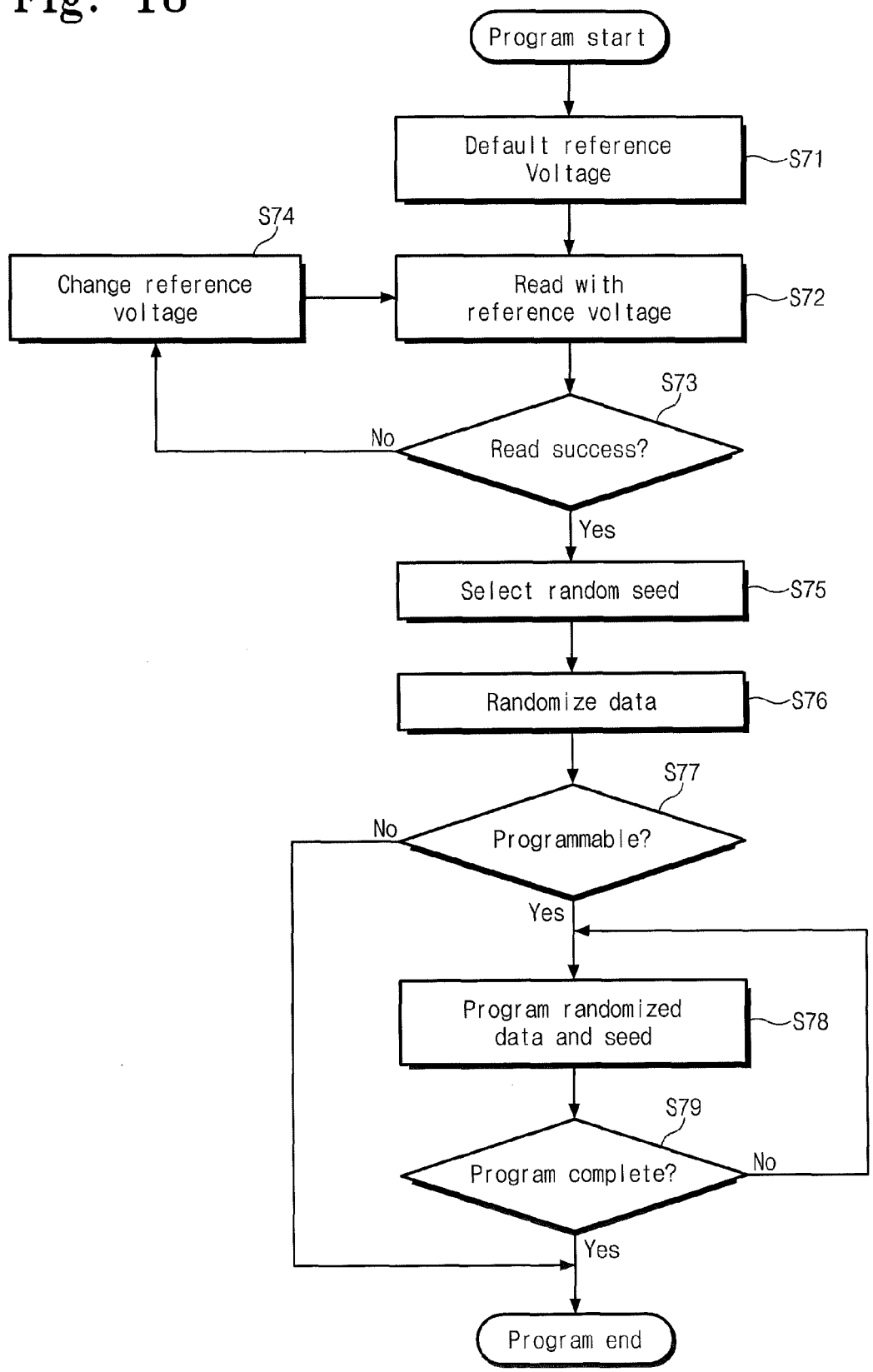
FIG. 18 is a flowchart illustrating a multi program method according to an embodiment of the present invention when input data in FIGS. 16 and 17 are randomized.

FIG. 18 is a flowchart illustrating a multi program method according to an embodiment of the present invention when input data in FIGS. 16 and 17 are randomized.

Referring to FIG. 18, a multi program method according to an embodiment of the present invention sets a default reference voltage for detecting the current state of a multi program cell in operation S71, performs a read operation with the set reference voltage in operation S72, and determines whether the read operation succeeds in operation S73. When the read operation fails, the multi program method changes the reference voltage in operation S74. When the read operation succeeds, the multi program method determines a seed for randomizing input data in operation S75, and randomizes the input data according to the determined seed in operation S76.

With respect to the reference voltage according to an embodiment of the present invention, an intermediate level of default reference voltage among a plurality of reference voltages is set as a default reference voltage for quickly detecting the current state of a memory cell.

That is, when a read operation is executed with the intermediate level of default reference voltage, the current state of the memory cell may be read as '0' or '1'. When '1' is read, the reference voltage is set as a lower reference voltage. When '0' is read, the reference voltage is set as a higher reference voltage. Accordingly, the current detailed state of the memory cell is detected. A time for detecting the state of the memory cell according to an embodiment of the present invention is further shortened than a case in which the reference voltages are applied in ascending order from a low voltage to a high voltage.

The multi program method determines whether the randomized data may be programmed in operation S77. When the randomized data may not be programmed, the multi program method ends programming. When the randomized data may be programmed, the multi program method programs the randomized input data according to the seed in operation S78, and determines whether a program operation is completed in operation S79. When the program operation is completed, the multi program method ends the program operation.

Figure 19:
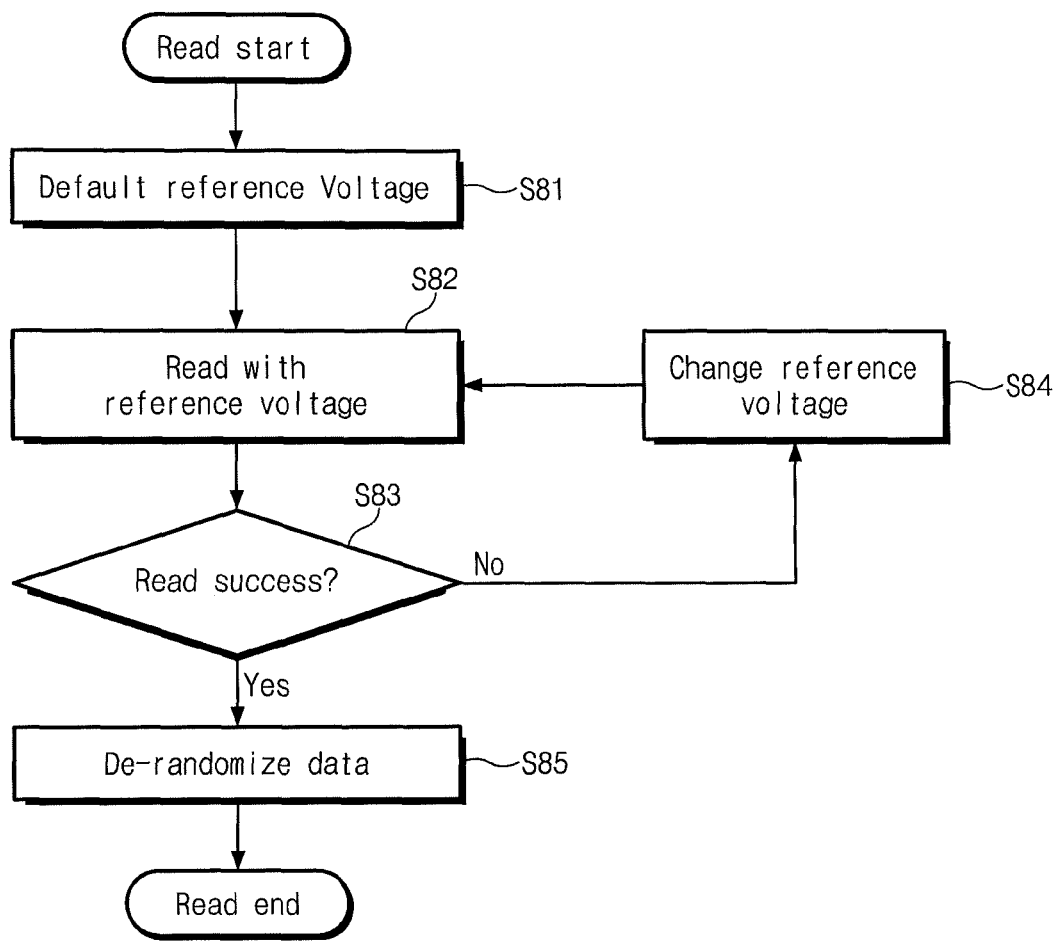
FIG. 19 is a flowchart illustrating a read method according to an embodiment of the present invention when input data in FIGS. 16 and 17 are randomized.

FIG. 19 is a flowchart illustrating a read method according to an embodiment of the present invention when input data in FIGS. 16 and 17 are randomized.

Referring to FIG. 19, a read method according to an embodiment of the present invention sets a default reference voltage for detecting the current state of a multi program cell in operation S81, performs a read operation with the set reference voltage in operation S82, and determines whether the read operation succeeds in operation S83. When the read operation fails, the read method changes the reference voltage in operation S84. When the read operation succeeds, the read method derandomizes randomized data in operation S85, and ends reading.

Figure 20:
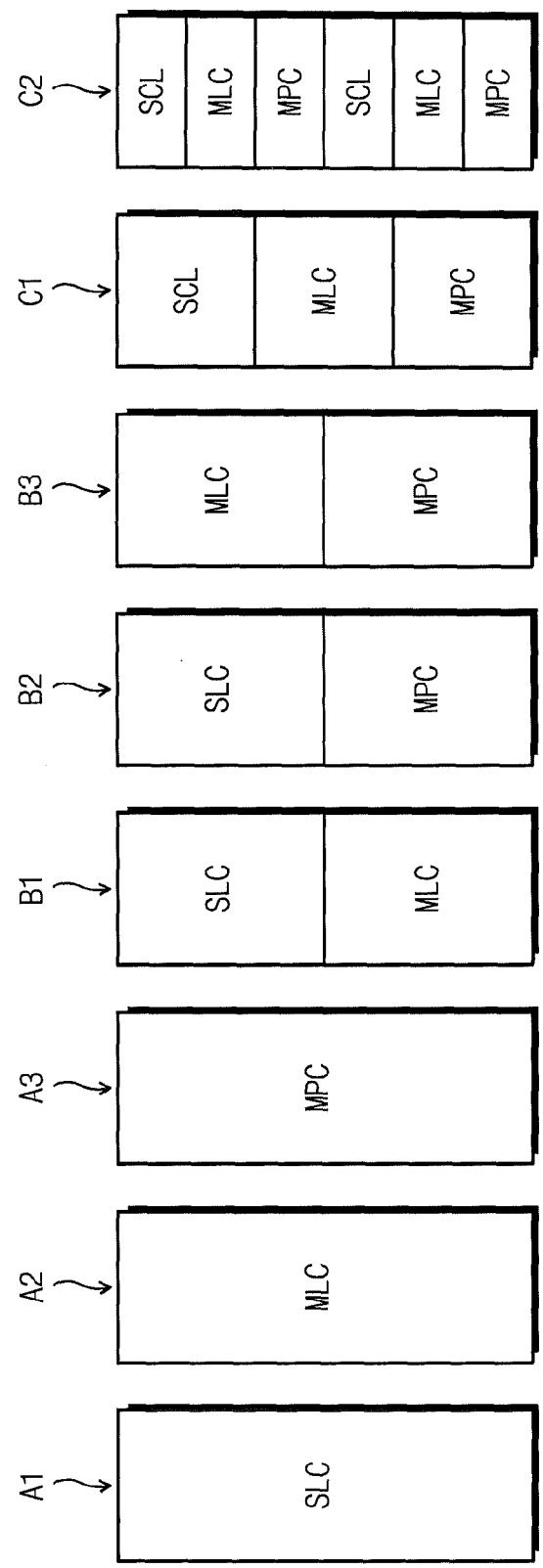
FIG. 20 is a diagram illustrating a flash memory device according to another embodiment of the present invention.

FIG. 20 is a diagram illustrating a flash memory device according to another embodiment of the present invention.

In FIG. 20, A1, A2 A3, B1, B2, B3, C1 and C2 indicates a memory cell array. A1 is used as an SLC corresponding to an entire area as, A2 is used as an MLC corresponding to an entire area, and A3 is used as a Multi Programmable Cell (MPC) corresponding to an entire area. B1, B2 and B3 are used by combining two kinds of levels, respectively. C1 and C2 are used as three kinds of memory cells by dividing an entire area.

The memory device according to an embodiment of the present invention may use an SLC area when fast writing performance is required although update is not frequently performed. The memory device requires writing performance that is not fast relatively, and when large-scale data are written, the memory device may use an MLC area capable of storing LSB/MSB information in one cell. Moreover, the memory device uses a portion (which requires a frequent update) as an MPC area, and thus can effectively operate its performance.

In the memory cell array according to an embodiment of the present invention, the area of the memory cell array may be divided on the following methods. First, there is a method that divides the area with a block boundary and operates the divided area. Second, there is a method that divides the area with a page boundary and operates the divided area.

When the area is divided with the page boundary and the divided area is operated, the amount of information to be maintained may further increase than the method that divides the area with the block boundary and operates the divided area, but management may be subdivided. Accordingly, a memory area can be effectively used.

The memory device according to an embodiment of the present invention controls a voltage level necessary for an operation according to the number of program times upon a program operation and a read operation. Moreover, the memory device divides and operates an area depending on the case.

The multi program method in the memory device according to an embodiment of the present invention is largely divided into two methods. One method uses a typical command set, and another method uses new command set.

The method using the typical command set uses a typical program command set as-is. The method using the typical command set determines with which voltage level a program is executed through a program counter in the flash memory device. Moreover, the method using the typical command set uses a typical read command set as-is. The method using the typical command set determines with which voltage level read is performed through the program counter in the flash memory device. The method using the typical command set enables to assign a voltage level upon a program operation by using the unused bit of an address cycle in the typical program command set. The method using the typical command set enables to assign a voltage level upon a read operation by using the unused bit of an address cycle in the typical read command set. The method using the typical command set completes a program operation and thereafter enables to check how many times a corresponding page is programmed with an unused bit by use of a status read command. The method using the typical command set completes a read operation and thereafter enables to check at which voltage level a corresponding page is read with an unused bit by use of the status read command. The method using the typical command set enables to check whether an assigned page is set as an SLC, an MLC or an MPC with an unused bit by use of the status read command. The method using the typical command set enables to check at which voltage level a current read operation is performed with an unused bit by using the status read command at a section 'tR busy'. The method using the typical command set enables to check at which voltage level a current writing operation is performed with an unused bit by using the status read command at a section 'tPROG busy'.

The method using the new command set adds a command set for setting an assigned block as an SLC, an MLC or an MPC. The method using the new command set adds a command set for setting an assigned page as an SLC, an MLC or an MPC. The method using the new command set adds a command set for checking as which area of an SLC, an MLC and an MPC an assigned block is used. The method using the new command set adds a command set for checking as which area of an SLC, an MLC and an MPC an assigned page is used. When a program counter is maintained for each page, the method using the new command set adds a command set for checking that in which the program counter is maintained for each page. The method using the new command set enables to assign a program voltage level with an additional cycle upon a program operation. The method using the new command set prepares and operates different command sets for each voltage level upon a program operation. The method using the new command set enables to assign a read voltage level with an additional cycle upon a read operation. The method using the new command set prepares and operates different command sets for each voltage level upon a read operation.

In a flash memory device, the number of times a writing operation is performed in one page is four times in a case where a partial writing operation is performed in an SLC, and it is one time in the case of an MLC. Moreover, when the partial writing operation is performed in the SLC, the number of times the same memory cell is programmed is one time.

When a writing operation may be performed several times in the same page without an erasion operation in a flash memory device, the flash memory device according to embodiments of the present invention can reduce the number of erasion times by the number of times the writing operation is performed. Accordingly, the flash memory device according to embodiments of the present invention can improve reliability.

The flash memory device according to embodiments of the present invention allows an overwriting operation in the same memory cell, and thus, if the flash memory device is applied to data that are frequently updated, it can enhance space efficiency.

Moreover, the flash memory device according to embodiments of the present invention decreases the movement of data, thereby improving the performance of a system including it.

Figure 21:
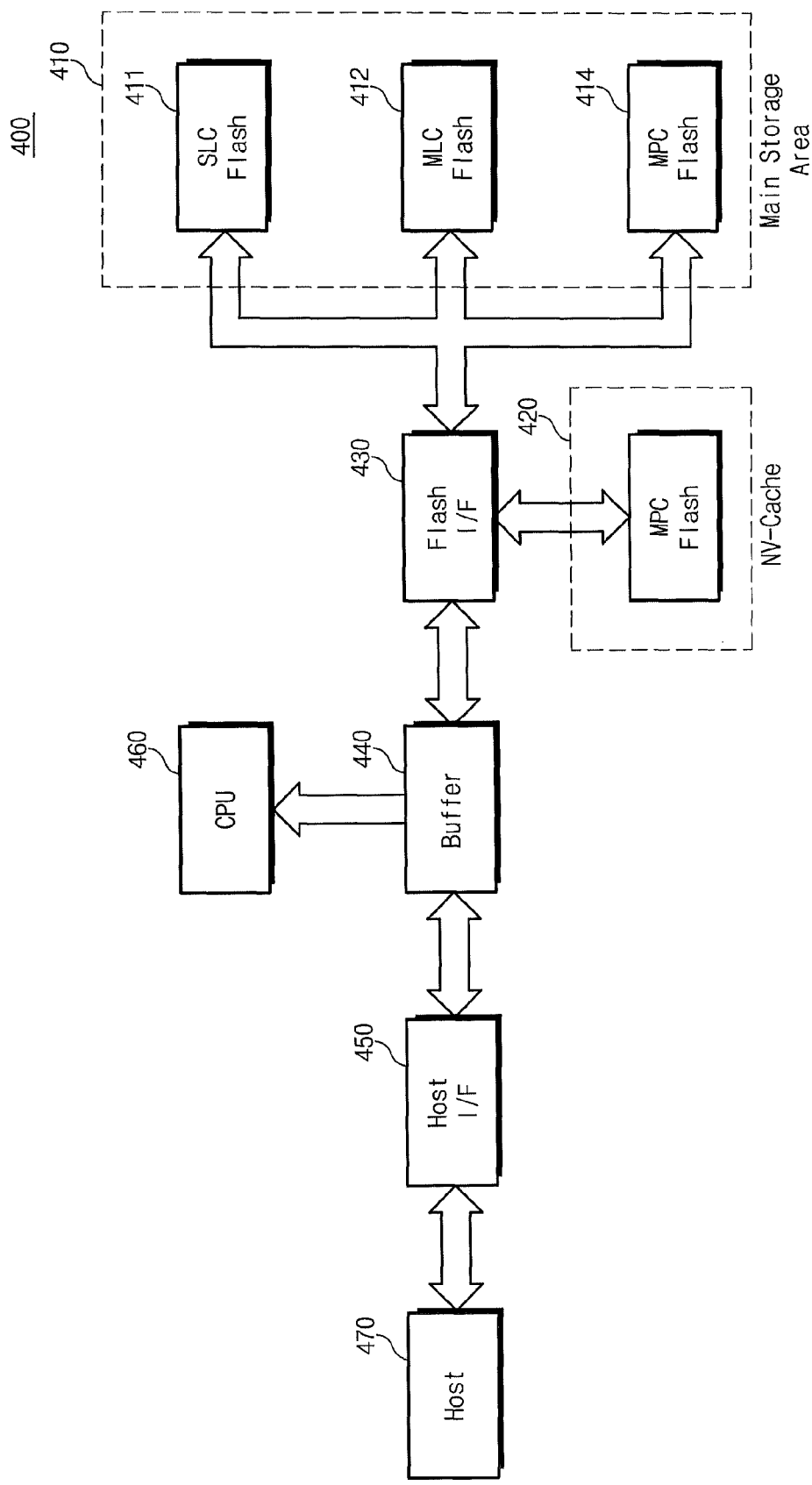
FIG. 21 is a block diagram illustrating a multi program flash memory system according to an embodiment of the present invention.

The flash memory device is a nonvolatile memory device that can maintain stored data although a power is shut off. As the use of mobile devices such as cellular phones, Personal Digital Assistants (PDA), digital cameras, portable game consoles and MP3P increases, the flash memory device is widely used as data storages and code storages. The flash memory device, moreover, may be applied to home applications such as High Definition Televisions (HDTV), Digital Video Disks (DVD), routers and Global Positioning Systems (GPS). FIG. 21 schematically illustrates a computing system including the memory system according to embodiments of the present invention. In FIG. 21, that is, the configuration of various storage systems to which a multi-programmable memory device is applied is illustrated.

FIG. 21 is a block diagram illustrating a multi program flash memory system according to an embodiment of the present invention.

Referring to FIG. 21, a computing system 400 according to an embodiment of the present invention a CPU 460 that is electrically connected to a bus, a host interface 450 that is connected to a host 470, a buffer circuit 440 that transmits the data of a nonvolatile cache 420 and the data of a main storage area 410 to the CPU 460, and a flash interface 430 that interfaces the nonvolatile cache 420 and the main storage area 410. The multi program cell 414 of the main storage area 410 and the nonvolatile cache 420 is the memory device according to embodiments of the present invention.

The memory device according to embodiments of the present invention may perform updating without an erasion operation. Accordingly, if the memory device is applied to an area that is relatively frequently updated, it has better performance than a typical storage system that is composed of only an SLC or an MLC.

Moreover, the memory device according to embodiments of the present invention has characteristic in which it may be updated, and thus, can further improve the performance of a storage system when it is used as a writing cache other than a typical storage.

The memory device according to embodiments of the present invention can apply a more flexible cache structure than a nonvolatile cache using a typical NAND flash memory device. Accordingly, the memory device according to embodiments of the present invention can further enhance the performance of the storage system.

Although not shown, an application chipset, a camera image processor and a mobile Dynamic Random Memory Access Memory (DRAM) may be provided in the computing system according to an embodiment of the present invention. This is apparent to those skilled in the art.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A nonvolatile memory device, comprising:
a multi-level memory cell capable of being programmed to any one of a plurality of program states; and
a control logic configured to overwrite old one-bit data stored in the multi-level memory cell with new one-bit data referring to a program count of the multi-level memory cell such that the old one-bit data is overwritten without performing an erase operation on the memory cell, and configured to update the program count,
wherein the new one-bit data is readout through single read operation in accordance with the updated program count.

2. The nonvolatile memory device of claim 1,
the program count determines which one of a plurality of verification voltages is used for the overwrite.

3. The nonvolatile memory device of claim 2, wherein the control logic is further configured to control reading of the multi-level cell based on the updated program count, and the updated program count determines which one of a plurality of read voltages is used for the reading.

4. The nonvolatile memory device of claim 2, wherein the control logic is further configured such that when the new one-bit data to be updated differ from the stored data in the multi-level cell, the multi-level cell is programmed with the logic of the new one-bit data to be updated according to a corresponding verification voltage.

5. The nonvolatile memory device of claim 4, wherein the control logic is further configured such that when the new one-bit data to be updated are the same as the stored data, a current state of the multi-level cell is maintained.

6. The nonvolatile memory device of claim 1, wherein the control logic is further configured to generate an error signal and configured to disable the overwrite operation if the program count is corresponding to a highest program stage among the plurality of program states.

7. A method of accessing a multi-level cell capable of being programmed to any one of a plurality of program states, comprising:
overwriting one-bit data into the multi-level cell and verifying whether the multi-level cell is programmed, by using a verify voltage corresponding to the number of overwriting times; and
reading the one-bit data stored in the multi-level cell by using a read voltage corresponding to the number of overwriting times,
wherein the verify voltage and the read voltage become higher with an increase in the number of overwriting times,
wherein the one-bit data is not reversible after overwriting.

8. The method as set forth in claim 7, wherein:
if the one-bit data is logic '1' at the overwriting, the multi-level cell is controlled to maintain a current program state.

9. The method as set forth in claim 7, wherein:
if the one-bit data is logic '0' at the overwriting, the multi-level cell is programmed to a higher program state than a reference voltage irrespective of a current state of the multi-level cell.

10. The method as set forth in claim 7, further comprising:
updating the number of overwriting times when the overwriting is completed.

11. The method as set forth in claim 7, wherein:
the number of overwriting times is stored in a page including the multi-level cell or a memory area that is different from the page.

12. A method of overwriting one-bit data into a multi-level cell having a plurality of program states, comprising:
alternately assigning logic '0' and logic '1' to the respective program states of the multi-level cell according to the magnitude of a threshold voltage;
detecting a current program state of the multi-level cell;
comparing assigned data corresponding to the current program state with the one-bit data; and
maintaining the current program state or programming the multi-level cell to a higher program state than the current program state according to a result of the comparing,
wherein the one-bit data is not reversible after overwriting.

13. The method as set forth in claim 12, further comprising:
programming the multi-level cell; and
updating the number of overwriting times of the multi-level cell.

14. The method as set forth in claim 13, wherein:
a logic value of the one-bit data stored in the multi-level cell is determined with reference to the updated number of overwriting times at a read operation.

* * * * *